(12) United States Patent
Fuergut et al.

(10) Patent No.: US 7,883,993 B2
(45) Date of Patent: Feb. 8, 2011

(54) SEMICONDUCTOR DEVICE WITH SEMICONDUCTOR CHIP AND REWIRING LAYER AND METHOD FOR PRODUCING THE SAME

(75) Inventors: Edward Fuergut, Dasing (DE); Hermann Vilsmeier, Regensburg (DE); Holger Woerner, Regensburg (DE)

(73) Assignee: Infineon Technologies AG, Neubiberg (DE)

( * ) Notice: Subject to any disclaimer, the term of this patent is extended or adjusted under 35 U.S.C. 154(b) by 871 days.

(21) Appl. No.: 11/476,046

(22) Filed: Jun. 28, 2006

(65) Prior Publication Data
US 2006/0246624 A1 Nov. 2, 2006

Related U.S. Application Data

(62) Division of application No. 10/985,051, filed on Nov. 10, 2004, now Pat. No. 7,091,595.

(30) Foreign Application Priority Data
Nov. 11, 2003 (DE) .................................. 103 52 946

(51) Int. Cl.
*H01L 21/00* (2006.01)
*H01L 23/14* (2006.01)

(52) U.S. Cl. ........................ 438/464; 438/108; 438/109; 438/123; 257/702

(58) Field of Classification Search ................. 257/702; 438/123, 108, 109, 464
See application file for complete search history.

(56) References Cited

U.S. PATENT DOCUMENTS

| 5,200,362 | A |   | 4/1993  | Lin et al. |
|-----------|---|---|---------|------------|
| 5,508,565 | A | * | 4/1996  | Hatakeyama et al. ........ 257/777 |
| 5,767,570 | A |   | 6/1998  | Rostoker |
| 5,872,700 | A | * | 2/1999  | Collander .................... 361/760 |
| 6,309,910 | B1 |  | 10/2001 | Haba et al. |
| 6,432,749 | B1 | * | 8/2002 | Libres ........................ 438/122 |
| 6,541,871 | B2 |  | 4/2003  | Pai et al. |
| 6,646,335 | B2 |  | 11/2003 | Emoto |
| 6,701,614 | B2 | * | 3/2004 | Ding et al. .................... 29/848 |
| 6,737,750 | B1 | * | 5/2004 | Hoffman et al. ............ 257/777 |
| 6,787,393 | B2 |  | 9/2004  | Jin et al. |
| 6,917,103 | B2 | * | 7/2005 | Hirano et al. ............... 257/707 |
| 6,919,508 | B2 | * | 7/2005 | Forcier ....................... 174/565 |
| 2002/0020898 | A1 | * | 2/2002 | Vu et al. .................... 257/676 |
| 2002/0038722 | A1 | * | 4/2002 | Mori .......................... 174/260 |

(Continued)

FOREIGN PATENT DOCUMENTS

EP 0 915 505 A1 5/1999

(Continued)

*Primary Examiner*—Matthew C Landau
*Assistant Examiner*—James M Mitchell
(74) *Attorney, Agent, or Firm*—Edell, Shapiro & Finnan, LLC (57) ABSTRACT

The invention relates to a semiconductor device with a semiconductor chip and a rewiring layer, the semiconductor chip being embedded in a housing plastics composition by its rear side contact. The active top side of the semiconductor chip forms a coplanar overall top side with the top side of the housing plastics composition. The rear side contact is led to the overall top side via a flat conductor sheet tape, so that the rear side contact of the semiconductor chip can be accessed from the overall top side.

13 Claims, 5 Drawing Sheets

U.S. PATENT DOCUMENTS

| | | |
|---|---|---|
| 2002/0094604 A1* | 7/2002 | Hayama et al. ............. 438/108 |
| 2002/0109216 A1* | 8/2002 | Matsuzaki et al. .......... 257/686 |
| 2002/0163077 A1 | 11/2002 | Kuwahara et al. |
| 2003/0122237 A1* | 7/2003 | Saeki ......................... 257/686 |
| 2003/0197284 A1* | 10/2003 | Khiang et al. ............... 257/777 |
| 2004/0070083 A1* | 4/2004 | Su ............................. 257/778 |
| 2004/0197954 A1* | 10/2004 | Moden ....................... 438/108 |
| 2004/0245608 A1* | 12/2004 | Huang et al. ................ 257/676 |
| 2010/0047970 A1* | 2/2010 | Eichelberger et al. ....... 438/121 |

FOREIGN PATENT DOCUMENTS

| | | |
|---|---|---|
| JP | 56-122157 | 9/1981 |
| WO | WO 03/015165 A2 | 2/2003 |

\* cited by examiner

FIG 18

SEMICONDUCTOR DEVICE WITH SEMICONDUCTOR CHIP AND REWIRING LAYER AND METHOD FOR PRODUCING THE SAME

CROSS REFERENCE TO RELATED APPLICATIONS

This application is a divisional of U.S. patent application Ser. No. 10/985,051, filed Nov. 10, 2004 now U.S. Pat. No. 7,091,595, and entitled, "Semiconductor Device with Semiconductor Chip and Rewiring Layer and Method for Producing the Same"; which claims priority under 35 USC §119 to German Application No. DE 103 52 946.2, filed on Nov. 11, 2003, and titled "Semiconductor Device with Semiconductor Chip and Rewiring Layer and Method for Producing the Same," the entire contents of which are hereby incorporated by reference.

FIELD OF THE INVENTION

The invention relates to a semiconductor device with a semiconductor chip and a rewiring layer, the semiconductor chip being embedded into a plastic housing composition by its rear side and its edge sides in such a way that the active top side of the semiconductor chip is arranged in coplanar fashion with respect to a top side of the housing plastics composition and forms an overall top side. A packaging of a plurality of semiconductor chips into a housing plastics composition with formation of an overall top side is also called "Wafer Level Package" or WLP and forms a composite board or a panel comprising plastics composition and semiconductor chips which are adapted in their dimensions to a semiconductor wafer.

BACKGROUND

On the coplanar overall top side of such a panel of WLP design, it is possible to apply a rewiring layer that connects contact areas on the top side of the semiconductor chip to external contact areas of the rewiring layer in a cost-effective manner. However, as yet a cost-effective contact system has not been disclosed by means of which rear side contacts which are not arranged on the overall top side but rather are embedded in the housing plastics composition can also be reached from the rewiring layer or from the overall top side.

SUMMARY OF THE INVENTION

It is an object of the invention to specify a semiconductor device with a semiconductor chip and a rewiring layer in which a rear side contact of the semiconductor chip can be accessed from the rewiring layer.

Another object of the invention is to provide a method which enables a semiconductor device to be produced cost-effectively.

The aforesaid objects are achieved individually and in combination, and it is not intended that the present invention be construed as requiring two or more of the objects to be combined unless expressly required by the claims attached hereto.

In accordance with the present invention, a semiconductor device includes a semiconductor chip and a rewiring layer. The semiconductor chip with its rear side and its edge sides is embedded into a housing plastics composition. The active top side of the semiconductor chip is arranged in coplanar fashion with respect to a top side of the housing plastics composition and forms an overall top side. This overall top side carries a rewiring layer, a flat conductor sheet tape being arranged within the housing plastics composition and extending from the overall top side of the semiconductor device to the rear side of the semiconductor chip. In this configuration, the flat conductor sheet tape is electrically connected to the rear side of the semiconductor chip.

Flat conductor sheet tapes of this type are used in TAB technology (Tape Automated Bonding) in order, in central bonding channels of a semiconductor chip, to connect the contact areas (having a size of a few micrometers) of an active top side of a semiconductor chip to a rewiring structure on the active top side of the semiconductor chip. According to the invention, a flat conductor sheet tape of this type is now used in order to create an electrical connecting line between a rear side of a semiconductor chip to an overall top side of the semiconductor device. The flat conductor sheet tape may have a flexible, tape-type plastic sheet coated with copper on one side, the copper coating of the flat conductor sheet tape being connected to the rear side contact of the semiconductor chip and to the rewiring layer on the overall top side of the semiconductor device.

A semiconductor device of this type has the advantage that the rear side of the semiconductor chip can also be electrically contact-connected from the overall top side. Thus, it is possible for a ground potential now to be applied to the rear side of the semiconductor chip from the overall top side or from the rewiring layer without the need to partly uncover the rear side of the semiconductor chip in the housing plastics composition in order to reach the rear side contact. Rather, the flat conductor sheet tape is already concomitantly embedded in the housing plastics composition and produces the desired electrical connecting line to a rear side contact of the semiconductor chip.

Instead of a flexible, tape-type plastic sheet coated with copper on one side as flat conductor sheet tape, it is also possible to use a metal sheet. A metal sheet has the advantage over a copper coating that it can be made thicker and the lead resistance can thus be reduced.

In a further embodiment of the semiconductor device, the flat conductor sheet tape is electrically connected to an external contact of the semiconductor device via the rewiring layer. For this purpose, the rewiring layer has rewiring lines that connect the end of the flat conductor sheet tape which is arranged on the coplanar overall top side to external contact areas which, for their part, carry external contacts. Consequently, the electrical path—from an external contact to the rear side of the semiconductor chip—comprises the rear side contact of the semiconductor chip, the flat conductor sheet tape, the rewiring line of the rewiring layer, the external contact areas of the rewiring layer and finally the external contact of the semiconductor device which is arranged on the external contact areas.

A further embodiment of the semiconductor device has a further, second semiconductor chip on the rear side of a first semiconductor chip. The further, second semiconductor chip is arranged with its rear side on the rear side of the first semiconductor chip. In this case, the second semiconductor chip is completely embedded in the plastic housing composition. In order that contact areas of the active top side of the second semiconductor chip which are completely embedded in the plastics composition are nevertheless reached electrically from the overall top side, flat conductor sheet tapes extend within the housing plastics composition from the contact areas on the active top side of the second semiconductor chip to the overall top side of the semiconductor device.

Consequently, with the aid of the invention's principle of a new contact system, it is also possible to realize a cost-effective stacking of semiconductor chips one above the other in a WLP design. Since the new contact system reaches both the rear side contacts of the semiconductor chips which are buried in the housing plastics composition, and the contact areas of an active top side of the second stacked semiconductor chip which are embedded in plastics composition, via corresponding flat conductor sheet tapes with the overall top side, it is now possible to apply cost-effectively on the overall top side a rewiring layer via which access is possible to all contact areas of the first and second semiconductor chips.

In this case, the principle according to the invention can be extended as desired by further semiconductor chips being stacked one on top of the other and being electrically connected to the overall top side via correspondingly arranged flat conductor sheet tapes. Such a stack comprising a plurality of semiconductor chips with flat conductor sheet tapes that are led out correspondingly can be embedded in a common housing plastics composition.

In another embodiment of the invention, a method for producing a panel with device positions arranged in rows and/or columns includes the following steps. First, provision is made of an auxiliary carrier, with a single-sided adhesive layer and a plurality of semiconductor device positions. On these semiconductor device positions, the active top sides of semiconductor chips are placed onto the adhesive layer of the auxiliary carrier. Afterward, a flat conductor sheet tape of a flat conductor sheet is fixed on the rear side contact of the semiconductor chip in the device positions. After a bending away of the flat conductor sheet tape with the flat conductor sheet tape being torn away from the flat conductor sheet, the free end of the torn-away flat conductor sheet tape is pressed onto the adhesive layer of the auxiliary carrier and fixed there.

A housing plastics composition is then applied to the auxiliary carrier, with embedding of the semiconductor chips and the flat conductor sheet tapes. In this case, an overall top side forms on the adhesive layer of the auxiliary carrier which, on the one hand, has the active top side of the semiconductor chip with corresponding contact areas of the semiconductor chip and, on the other hand, provides an end of the flat conductor sheet tape in the edge region of the active top side of the semiconductor chip. Afterward, the auxiliary carrier is removed with formation of a panel with a plurality of device positions.

After the removal of the auxiliary carrier with the adhesive layer of the auxiliary carrier, electrical contact connections both to the active top side of the semiconductor chip and to the rear side of the semiconductor chip are available on the coplanar top side, comprising housing plastics composition and contact areas. Onto this overall top side of the panel, rewiring layers with rewiring structures and external contact areas are then applied to the overall top side in the device positions. A self-supporting composite body is thus available in the form of a panel or a wafer in WLP technology.

This method has the advantage that it is possible cost-effectively to create a contact system for a panel or for a WLP structure in the case of which it is possible to reach both the contact areas on the active top side of the semiconductor chips and the rear side contacts of the semiconductor chips from the overall top side.

A method according to the invention for producing a semiconductor device firstly has the abovementioned production steps for producing a panel and then external contacts can be applied to the external contact areas of the rewiring layer. Afterward, the panel is divided into individual semiconductor devices. This method variant has the advantage that the external contacts can still be introduced simultaneously by means of a parallel method for all semiconductor devices in the framework of the panel.

Another method provides for firstly separating the panel into individual semiconductor devices and then applying the external contacts to the external contact areas of the semiconductor device. This method has the advantage that external contacts are applied only to such semiconductor devices which have already been tested in terms of their functioning and been found to be good prior to the separation of the panel, so that no external contacts that do not function are applied on the semiconductor chips.

A further method for producing a panel with stacked semiconductor chips in the device positions includes, in addition to the method for an individual semiconductor chip, the following steps. Before the semiconductor chip is packaged in a housing plastics composition, a further, second semiconductor chip is applied to the already mounted first semiconductor chip with rear side to rear side. Afterward, a flat conductor sheet is then oriented on the active top side of the second semiconductor chip and, in this case, at least one flat conductor sheet tape is fixed on a corresponding contact area of the active top side of the second semiconductor chip. Afterward, the flat conductor sheet tape is bent away from the top side of the second semiconductor chip in the direction of the adhesive layer of the auxiliary carrier, the flat conductor sheet tape being deposited and fixed on the adhesive layer.

When the flat conductor sheet tape is deposited, the flat conductor sheet tape is torn away from the flat conductor sheet at a desired breaking location provided. Once an electrical connection has thus been effected from the active top side of the second semiconductor chip in the direction of the overall top side to be formed, a plastic housing composition may be applied to the auxiliary carrier and, in this case, the semiconductor chips and the flat conductor sheet tapes may be embedded in the plastics composition. Afterward, the auxiliary carrier is removed from the overall top side with formation of the panel with a plurality of device positions. Next, a rewiring layer with a rewiring structure and external contact areas is applied to the overall top side in the respective device positions of the panel. As in the case of the first embodiment of the invention, the application of the external contacts may be applied to the corresponding external contact areas of the rewiring layer either before the panel is separated into individual devices or after the panel is separated into individual devices.

To summarize, it shall be emphasized that, by application of known technologies, such as WLP technology and such as the TAB method, connecting lines are produced from chip rear sides or from active top sides of stacked semiconductor chips to a rewiring plane in a WLP design. This affords the advantage that rear side contacts of the device can be contact-connected from the overall top side or that stacking of semiconductor chips becomes possible even in the case of a WLP device.

When producing a rear side contact, the semiconductor chip to be mounted is applied by its active top side on an auxiliary carrier coated with an adhesive sheet. The semiconductor chip additionally has a rear side metallization with which contact can be made. Then, a conductor track that is coated or mounted onto a sheet, in the form of a flat conductor sheet tape, is positioned on the rear side metallization and a conductive connection is produced on the chip rear side with the conductor track of the flat conductor sheet tape that is used, by means of the so-called Tape Automated Bonding method (TAB). Afterward, the second end of the conductor track of the flat conductor sheet tape is pressed onto the surface of the adhesive auxiliary carrier until it adheres in a positionally accurate manner on the adhesive side of the auxiliary carrier. The next process steps are effected analogously to the production of WLP devices. After the application of the housing plastics composition by means of molding and after the removal of the auxiliary carrier, both contacts of the semiconductor chip and the contact of the rear side of the semiconductor chip are then ready for rewiring at the same level of the coplanar overall top side.

The electrical connection of a stacked semiconductor chip is effected after the mounting of a second semiconductor chip on the original semiconductor chip by effecting a completely analogous procedure. However, there is situated on the flat conductor sheet not an individual conductor track, like for the rear side contact-connection, but rather an arrangement of a plurality of flat conductor sheet tapes that is adapted to the contact areas and the functionality of the chip.

The above and still further objects, features and advantages of the present invention will become apparent upon consideration of the following detailed description of specific embodiments thereof.

BRIEF DESCRIPTION OF THE DRAWINGS

The invention will now be explained in more detail with reference to the accompanying figures.

DETAILED DESCRIPTION

Figure 1:
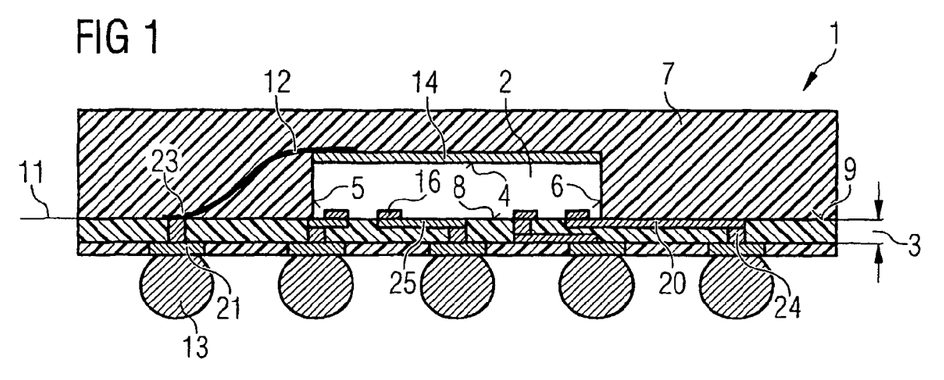
FIG. 1 shows a diagrammatic cross section through a semiconductor device of a first embodiment of the invention.

FIG. 1 shows a diagrammatic cross section through a semiconductor device 1 of a first embodiment of the invention. The semiconductor device 1 has an overall top side 11, in which the active top side 8 of a semiconductor chip 2 and the top side 9 of a housing plastics composition 7 are oriented in coplanar fashion. There are arranged on this overall top side 11 not only contact areas 16 of the semiconductor chip 2 but also a contact connection 23, which is connected to a rear side contact 14 of the rear side 4 of the semiconductor chip 2 via a flat conductor sheet tape 12.

Arranged on the overall top side 11 of the semiconductor device 10 is a rewiring layer 3 having through contacts 24 to external contact areas 21 on which external contacts 13 are arranged. At least one of said external contacts 13 is connected via an external contact area 21 and a through contact 24 to the contact connection 23 which, for its part, is electrically connected to the rear side contact 14 of the semiconductor chip 2 via the flat conductor sheet tape 12. The other external contacts 13 are connected to the contact areas 16 at the active top side 8 of the semiconductor chip 2 via corresponding external contact areas 21 and rewiring lines 25 of a rewiring structure 20 in the rewiring layer 3.

The advantages of this embodiment in accordance with FIG. 1 are discussed extensively above and omitted in order to avoid repetition at this juncture.

Figure 2:
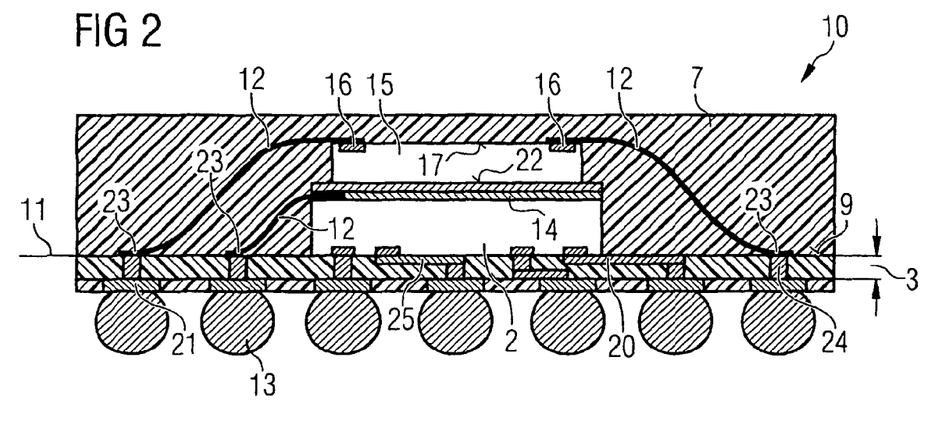
FIG. 2 shows a diagrammatic cross section through a semiconductor device of a second embodiment of the invention.

FIG. 2 shows a diagrammatic cross section through a semiconductor device 10 of a second embodiment of the invention. Components having functions identical to those in FIG. 1 are identified by the same reference symbols and are not discussed separately.

The semiconductor device 10 of the second embodiment of the invention differs from the semiconductor device 1 in accordance with FIG. 1 by the fact that a further, second semiconductor chip 15 is applied by its rear side 22 on the rear side 4 of a first semiconductor chip 2. The two rear side contacts 14 of these stacked semiconductor chips 2 and 15 lie on top of one another and are connected via a flat conductor sheet tape 12 to a contact connection 23 on the overall top side 11 of the semiconductor device 10. In addition to this ground potential line constituted by the flat conductor sheet tape 12, further flat conductor sheet tapes 12 are arranged in the housing plastics composition 7 which connect contact areas 16 of the active top side 17 of the second semiconductor chip 15 to contact connections 23 on the overall top side 11 of the semiconductor device 10. The rewiring layer 3 is constructed analogously to the first embodiment of the invention and is not discussed separately in order to avoid repetition.

FIGS. 3 to 10 show diagrammatic cross sections through components of successive method steps during the production of a semiconductor device, in accordance with the first embodiment of the invention according to FIG. 1. Components having functions identical to those in the previous FIG.s are identified by the same reference symbols in FIGS. 3 to 10 and are not discussed separately.

Figure 3:
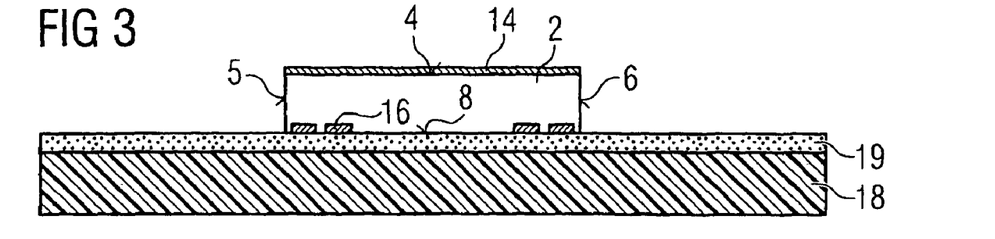
FIGS. 3 to 10 show diagrammatic cross sections through components of successive method steps which occur during the production of the semiconductor device of the first embodiment of the invention in accordance with FIG. 1.

FIG. 3 shows a diagrammatic cross section through an auxiliary carrier 18 with an adhesive layer 19. A semiconductor chip 2 is arranged with its active top side 8 and its contact pads 16 on said adhesive layer 19. A rear side metallization, which forms a rear side contact 14, is fitted on the rear side 4 of the semiconductor chip 2. The edge sides 5 and 6 are free of any contact-connection. The auxiliary carrier 18 is a planar plastic plate coated with an adhesive, FIG. 3 showing one device position of a plurality of device positions of a panel that are arranged in rows and/or columns.

Figure 4:
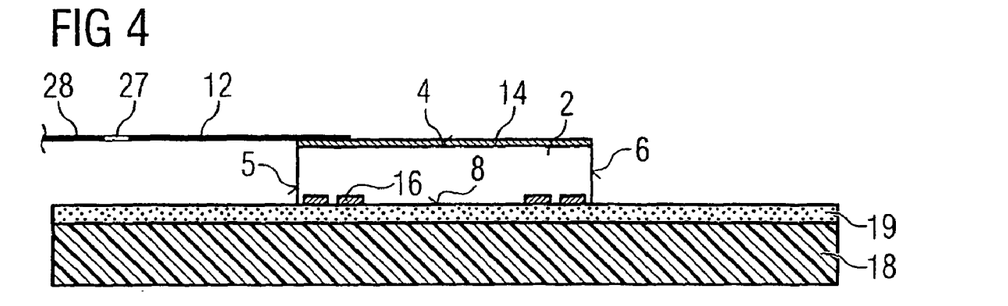

FIG. 4 shows a diagrammatic cross section through an auxiliary carrier 18 according to FIG. 3, with the semiconductor chip 2 arranged thereon, a flat conductor sheet tape 12 of a flat conductor sheet 28 additionally being oriented and positioned on the rear side contact 14 of the semiconductor chip 2. A desired breaking location 27 is arranged between the flat conductor sheet 28 and the flat conductor sheet tape 12. In this embodiment of the invention, the flat conductor sheet tape 12 has a copper- and/or gold-coated plastic sheet that is positioned with its coated side above the rear side metallization of the rear side contact 14 of the semiconductor chip 2. The flat conductor sheet tape 12 may also have a structured metal sheet.

Figure 5:
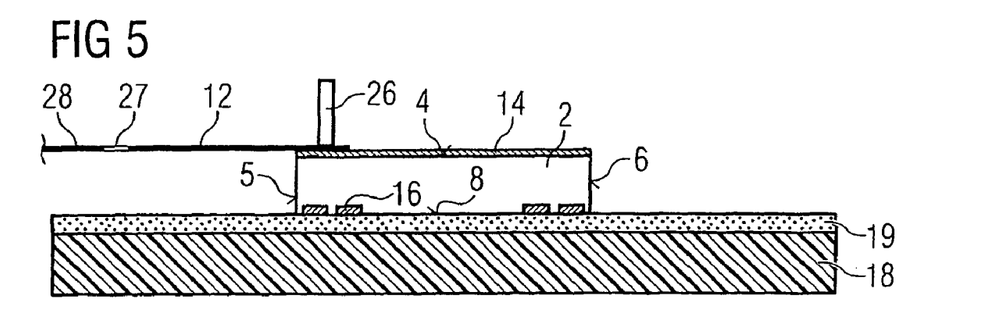

FIG. 5 shows a diagrammatic cross section through the auxiliary carrier 18 with the semiconductor chip 2 as can be seen in FIG. 4, but a tool 26 is additionally applied to an end of the flat conductor sheet tape 12 which is positioned on the rear side contact 14 of the semiconductor chip 2. This tool 26 is used to create an electrical connection between the rear side contact 14 and the flat conductor sheet tape 12, for example by a solderable coating being melted on the areas pressed onto one another.

Figure 6:
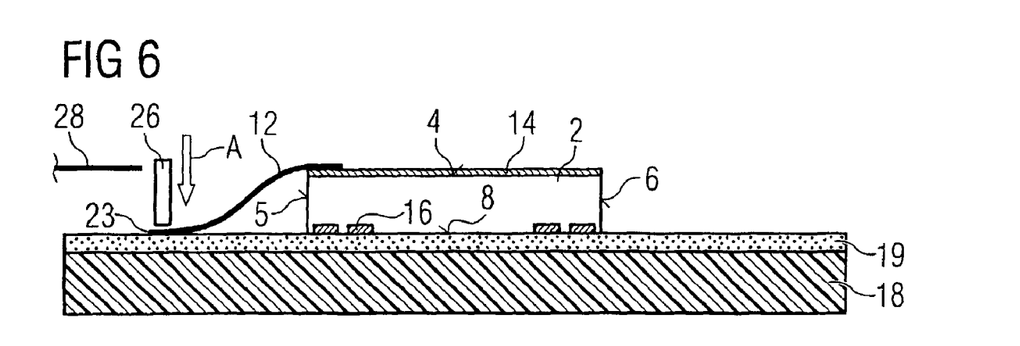

FIG. 6 shows a diagrammatic cross section through the auxiliary carrier 18 in accordance with FIG. 5 after the tool 26 has been brought to a second end of the flat conductor sheet tape 12. This second end of the flat conductor sheet tape 12 is arranged in the vicinity of the desired breaking location of the flat conductor sheet 28. Through pressure on the tool 26 in arrow direction A, the flat conductor sheet tape 12 is bent away whilst being torn away from the desired breaking location of the flat conductor sheet 28 and pressed onto the adhesive layer 19 of the auxiliary carrier 18. This method step creates a contact connection 23 on the plane of the adhesive layer 19 for an electrical connection to the rear side contact 14 of the semiconductor chip 2.

Figure 7:
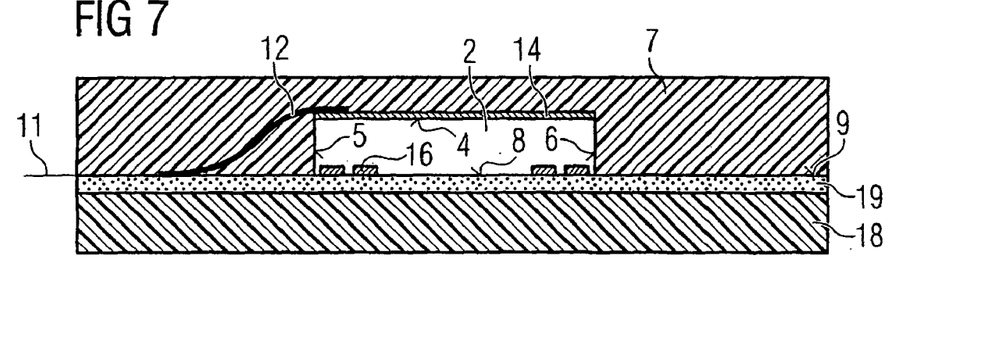

FIG. 7 shows a diagrammatic cross section through the auxiliary carrier 18 in accordance with FIG. 6 after the application of a housing plastics composition 7, with embedding of the semiconductor chip 2 and the flat conductor sheet tape 12. The housing plastics composition 7 has an epoxy resin filled with particles up to 95% by weight.

Figure 8:
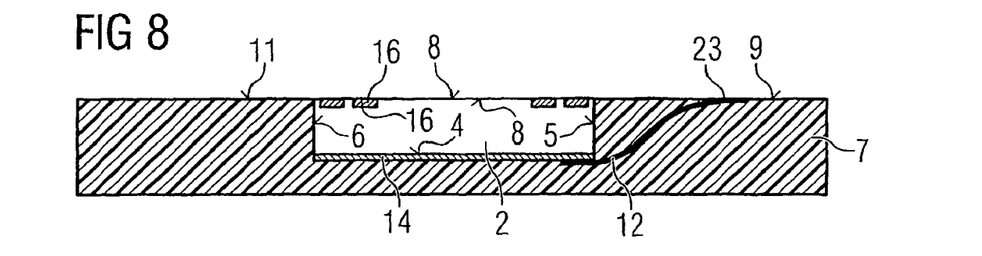

FIG. 8 shows a diagrammatic cross section through the housing plastics composition 7 in accordance with FIG. 7, after the removal of the auxiliary carrier 18 with adhesive layer 19 shown in FIG. 7. In addition, for the further method steps, the housing plastics composition 7 with the semiconductor chip 2 has been rotated through 180°, so that the overall top side 11 also locally constitutes a top side. The overall top side 11 is composed of the top side 9 of the housing plastics composition 7, furthermore of the contact connection 23 of the flat conductor sheet tape 12, and also of the active top side 8 of the semiconductor chip 2 with its contact areas 16. Consequently, on this coplanar overall top side 11, access is possible both to the contact areas 16 together of the active top side 8 of the semiconductor chip 2 and to the rear side contact 14 of the semiconductor chip 2.

Figure 9:
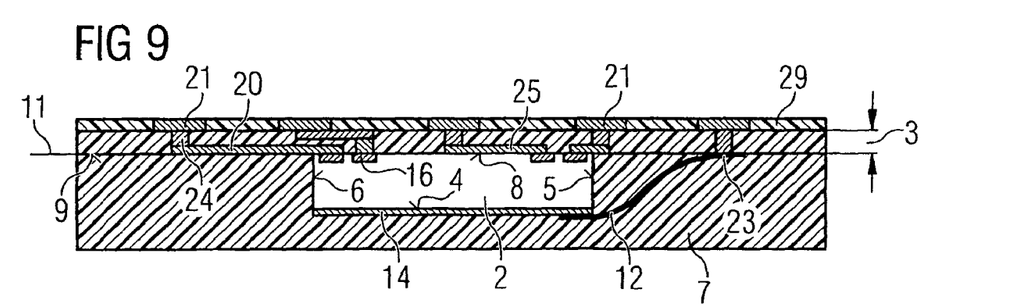

FIG. 9 shows a diagrammatic cross section through the housing plastics composition 7 in accordance with FIG. 8, after the application of a rewiring layer 3 to the overall top side 11. For this purpose, rewiring lines 25 may be applied directly on the overall top side 11, said rewiring lines being electrically connected via through contacts 24 or else directly to external contact areas 21. Arranged between the external contact areas 21 is a soldering resist layer 29, which ensures that other regions of the rewiring layer 3 are not wetted with the material of the external contacts during the application of external contacts to the external contact areas 21.

Figure 10:
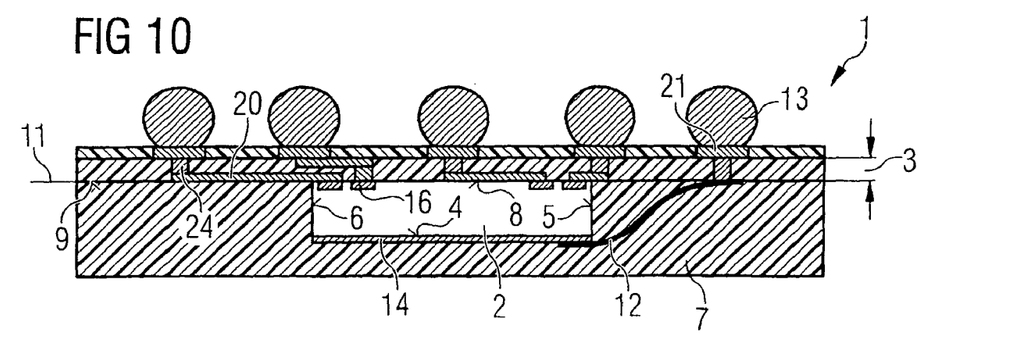

FIG. 10 shows a diagrammatic cross section through a semiconductor device 1 such as is also shown in FIG. 1 after external contacts 13 have been applied to the structure such as is shown in FIG. 9. The flat conductor sheet tape 12 introduced in this method thus makes it possible for a semiconductor device 1 which has been produced with the aid of WLP technology to be provided with an external contact 13 which is electrically connected to the rear side contact 14 of the semiconductor chip 2.

FIGS. 11 to 18 show diagrammatic cross sections through components of successive method steps which are provided during the production of a semiconductor device of the second embodiment of the invention in accordance with FIG. 2. Components having functions identical to those in the previous FIG.s are identified by the same reference symbols and are not discussed separately. The method steps that are illustrated diagrammatically in FIGS. 3 to 6 are also carried out for the production of the semiconductor device of the second embodiment of the invention, in accordance with FIG. 2.

Figure 11:
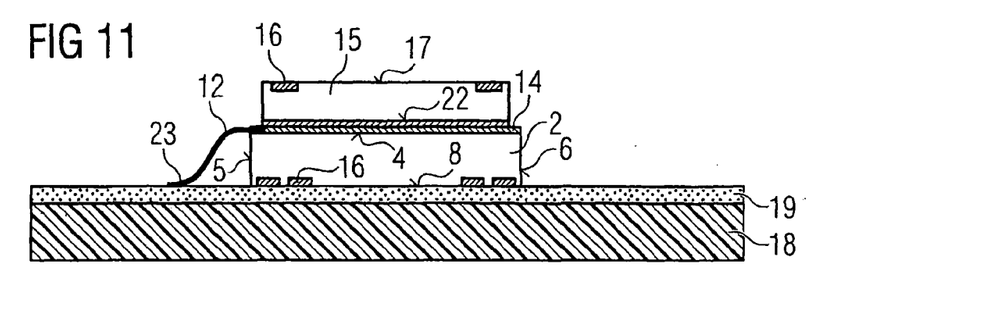
FIGS. 11 to 18 show diagrammatic cross sections through components of successive method steps which are provided during the production of the semiconductor device of the second embodiment of the invention, in accordance with FIG. 2.

FIG. 11 shows a diagrammatic cross section through an auxiliary carrier 18 with a semiconductor chip 2 and a flat conductor sheet tape 12 known from FIG. 6. In addition, a further, second semiconductor chip 15 has now been arranged on the first semiconductor chip 2 and has, with its rear side 22, a common rear side contact 14 with the underlying first semiconductor chip 2. Consequently, by means of the individual flat conductor tape 12, it is possible to produce a contact connection 23 arranged in the plane of the adhesive layer 19. Via this contact connection 23 with the bent-down flat conductor sheet tape 12, it is possible, for example, to apply a ground potential to the rear side contact 14.

Figure 12:
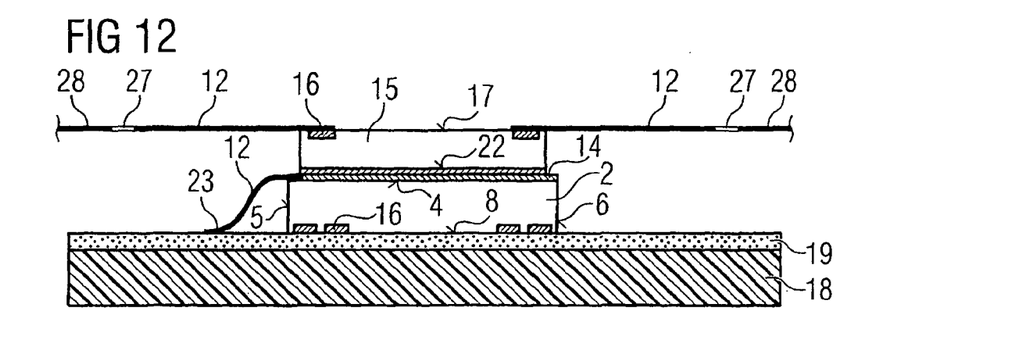

FIG. 12 shows a cross section after the positioning of a flat conductor sheet 28 above the active top side 17 of the second semiconductor chip 15, the flat conductor sheet 28 having a plurality of flat conductor sheet tapes 12 that are connected to the flat conductor sheet 28 via desired breaking locations 27.

Figure 13:
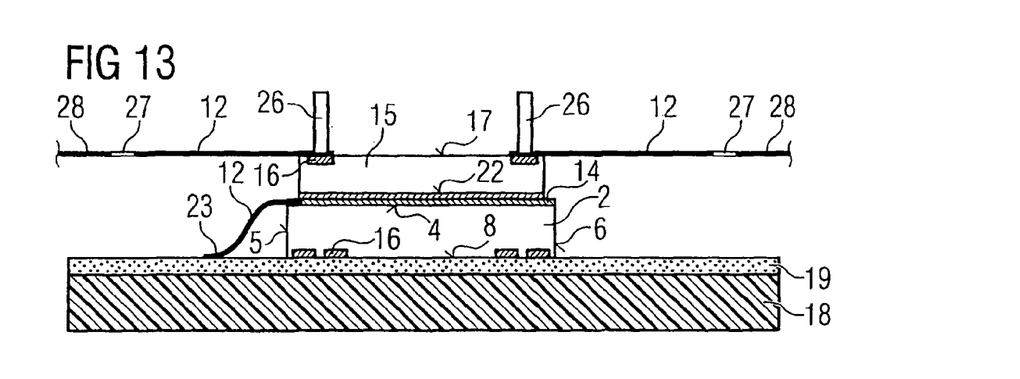

FIG. 13 shows a diagrammatic cross section through an auxiliary carrier 18 with a stack of semiconductor chips 2 and 15 situated thereon, in accordance with FIG. 12, tools 26 additionally producing an electrical connection between the contact areas 16 on the active top side 17 of the second semiconductor chip 15 and the flat conductor sheet tapes 12.

Figure 14:
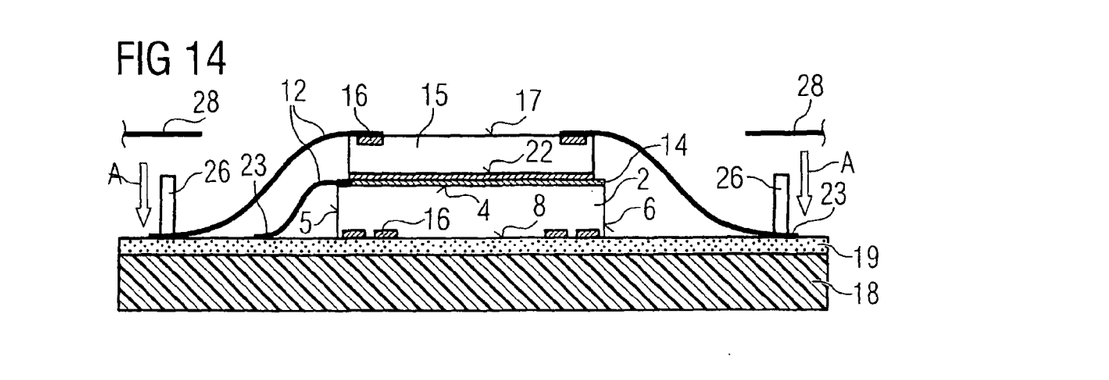

FIG. 14 shows a diagrammatic cross section through the auxiliary carrier 18 with a semiconductor chip stack in accordance with FIG. 13. In FIG. 14, the tools 26 have torn the flat conductor sheet tapes 12 away from the flat conductor sheet 28 at the desired breaking location. In this case, the tools 26 have bent the flat conductor sheet tapes 12 away in arrow direction A toward the adhesive layer 19 in order to form contact connections 23 and pressed them onto the adhesive layer 19. In this case, firstly only the free end of each of the flat conductor sheet tapes 12 is fixed on the adhesive layer 19 by means of contact pressure in arrow direction A.

Figure 15:
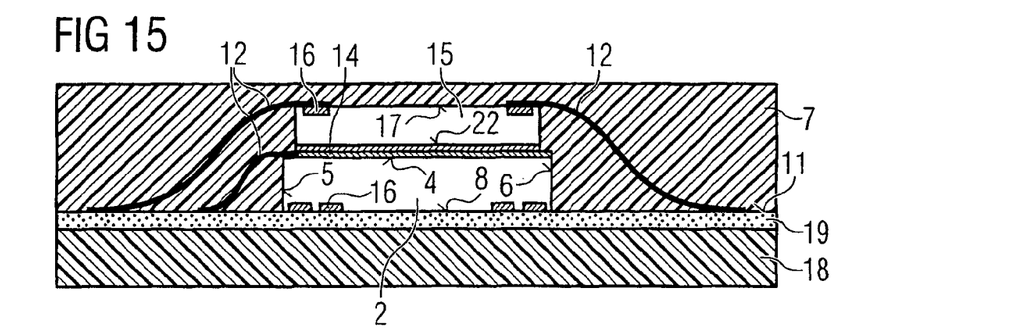

FIG. 15 shows a diagrammatic cross section through the auxiliary carrier 18 with applied housing plastics composition 7, which embeds the stacked semiconductor chips 2 and 15 and the flat conductor sheet tapes 12 into plastics composition.

Figure 16:
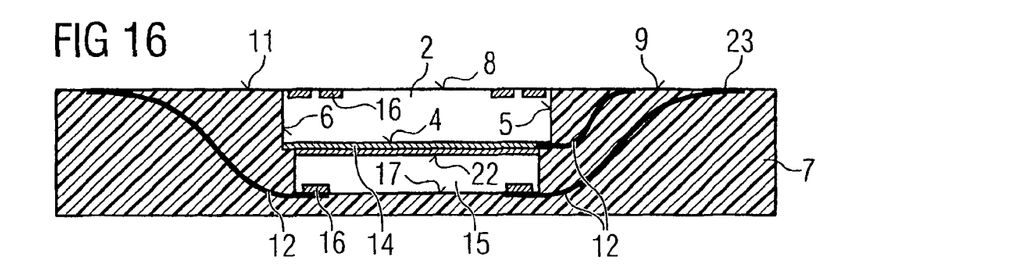

FIG. 16 shows a diagrammatic cross section through the plastics composition 7 after the auxiliary carrier 18 with the adhesive layer 19 as shown in FIG. 15 has been removed from the common top side 11. The common top side 11 now exhibits contact connections 23 both to the active top side 17 of the second semiconductor chip 15 and to the rear side contact-connection 14 between the two semiconductor chips 2 and 15. Moreover, the overall top side 11 exhibits contact areas 16 of the first semiconductor chip 2 on the active top side 8 thereof, so that, from the overall top side 11, it is possible to access the contact areas 16 of the first semiconductor chip 2 and of the second semiconductor chip 15 and also the rear side contacts 14 of the stacked semiconductor chips 2 and 15.

Figure 17:
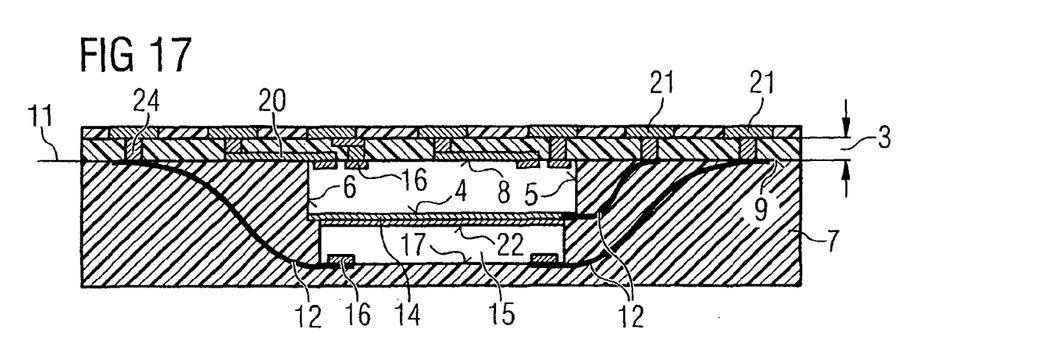

FIG. 17 shows the diagrammatic cross section in accordance with FIG. 16, but with a rewiring layer 3 on the overall top side 11. Said rewiring layer 3 corresponds to the rewiring layer 3 of FIG. 9 and is merely supplemented by connections to the contact areas 16 of the second semiconductor chip 15.

Figure 18:
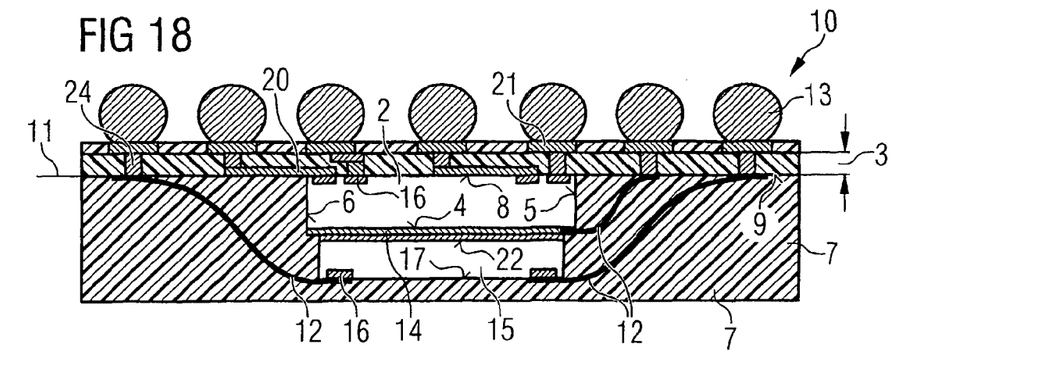

FIG. 18 shows a semiconductor device 10 of a second embodiment of the invention such as is already shown in FIG. 2, so that details of this second embodiment of the invention will not be discussed again.

While the invention has been described in detail and with reference to specific embodiments thereof, it will be apparent to one skilled in the art that various changes and modifications can be made therein without departing from the spirit and scope thereof. Accordingly, it is intended that the present invention covers the modifications and variations of this invention provided they come within the scope of the appended claims and their equivalents.

What is claimed:

1. A method for producing a panel with device positions arranged in rows and/or columns, comprising:
   providing an auxiliary carrier with a single-sided adhesive layer and a plurality of semiconductor device positions;

placing active top sides of a plurality of semiconductor chips onto the adhesive layer in the semiconductor device positions;

applying a flat conductor sheet to the semiconductor chips by fixing at least one flat conductor sheet tape of the flat conductor sheet on rear sides of the semiconductor chips disposed in the device positions;

bending the flat conductor sheet tape away from the rear side of the semiconductor chips in the direction of the adhesive layer of the auxiliary carrier so as to tear away conductor sheet tape portions from the flat conductor sheet at desired breaking locations and place the flat conductor sheet tape portions onto the adhesive layer;

forming the panel by applying a housing plastics composition to the auxiliary carrier so as to embed the semiconductor chips and the flat conductor sheet tape portions in the plastics composition and form an overall top side on the adhesive layer of the auxiliary carrier;

removing the auxiliary carrier from the panel to expose the overall top side; and applying a rewiring layer including a rewiring structure and external contact areas to the overall top side, wherein the external contact areas are disposed at locations along the overall top side that correspond with the semiconductor device positions.

2. The method of claim 1, further comprising:
separating the panel into individual semiconductor devices, wherein each semiconductor device includes at least one semiconductor chip and conductor sheet tape portion embedded within the housing plastics composition and at least one external contact area disposed on the overall top side of the semiconductor device.

3. The method of claim 2, further comprising:
applying external contacts to the external contact areas of the semiconductor devices.

4. The method of claim 1, further comprising, prior to embedding the semiconductor chips with the plastic housing composition:
applying a rear side of a second semiconductor chip to the rear side of at least one first semiconductor chip;
applying a flat conductor sheet to the second semiconductor chip by fixing at least one flat conductor sheet tape of the flat conductor sheet on a corresponding contact area of an active top side of the second semiconductor chip; and
bending the flat conductor sheet tape away from the active top side of the second semiconductor chip in the direction of the adhesive layer of the auxiliary carrier so as to tear away a conductor sheet portion from the flat conductor sheet at a desired breaking location and place the flat conductor sheet tape portion onto the adhesive layer.

5. The method of claim 1, wherein the overall top side formed on the adhesive layer of the auxiliary carrier comprises a coplanar surface defined by the flat conductor sheet tape portions, active top sides of semiconductor chips and a corresponding side of the plastics composition.

6. A method for producing a panel with stacked semiconductor chips in device positions, comprising:
providing an auxiliary carrier with a single-sided adhesive layer and a plurality of semiconductor device positions;
placing active top sides of a plurality of first semiconductor chips onto the adhesive layer in the semiconductor device positions;
applying a rear side of a second semiconductor chip to the rear side of at least one first semiconductor chip;
applying a flat conductor sheet to the second semiconductor chip by fixing at least one flat conductor sheet tape of the flat conductor sheet on a corresponding contact area of an active top side of the second semiconductor chip;
bending the flat conductor sheet tape away from the active top side of the second semiconductor chip in the direction of the adhesive layer of the auxiliary carrier so as to tear away a conductor sheet portion from the flat conductor sheet at a desired breaking location and place the flat conductor sheet tape portion onto the adhesive layer;
forming the panel by applying a housing plastics composition to the auxiliary carrier so as to embed the semiconductor chips and the flat conductor sheet tape portion in the plastics composition and form an overall top side on the adhesive layer of the auxiliary carrier;
removing the auxiliary carrier from the panel to expose the overall top side; and
applying a rewiring layer including a rewiring structure and external contact areas to the overall top side, wherein the external contact areas are disposed at locations along the overall top side that correspond with the semiconductor device positions.

7. The method of claim 6, further comprising:
separating the panel into individual semiconductor devices, wherein each semiconductor device includes at least one semiconductor chip and conductor sheet tape portion embedded within the housing plastics composition and at least one external contact area disposed on the overall top side of the semiconductor device.

8. The method of claim 7, further comprising:
applying external contacts to the external contact areas of the semiconductor devices.

9. The method of claim 6, wherein the overall top side formed on the adhesive layer of the auxiliary carrier comprises a coplanar surface defined by the flat conductor sheet tape portions, active top sides of first semiconductor chips and a corresponding side of the plastics composition.

10. A method for producing a panel with device positions arranged in rows and/or columns, comprising:
providing an auxiliary carrier with a single-sided adhesive layer and a plurality of semiconductor device positions;
placing a plurality of semiconductor chips at the semiconductor device positions, wherein at least some of the semiconductor chips are placed with active top sides of the semiconductor chips contacting the adhesive layer in the semiconductor device positions;
applying a flat conductor sheet to at least some of the semiconductor chips by fixing at least one flat conductor sheet tape of the flat conductor sheet on sides of semiconductor chips disposed in the device positions;
bending the flat conductor sheet tape away from the semiconductor chips to which the flat conductor sheet tape is affixed and in the direction of the adhesive layer of the auxiliary carrier so as to tear away conductor sheet tape portions from the flat conductor sheet at desired breaking locations and place the flat conductor sheet tape portions onto the adhesive layer;
forming the panel by applying a housing plastics composition to the auxiliary carrier so as to embed the semiconductor chips and the flat conductor sheet tape portions in the plastics composition and form an overall top side on the adhesive layer of the auxiliary carrier;
removing the auxiliary carrier from the panel to expose the overall top side; and
applying a rewiring layer including a rewiring structure and external contact areas to the overall top side, wherein the external contact areas are disposed at locations along the overall top side that correspond with the semiconductor device positions.

11. The method of claim 10, wherein the flat conductor sheet is applied to at least some semiconductor chips by fixing at least one flat conductor sheet tape of the flat conductor sheet on rear sides of semiconductor chips disposed in the device positions.

12. The method of claim 10, wherein:
the placing of a plurality of semiconductor chips at the semiconductor device positions further includes applying a rear side of a second semiconductor chip to the rear side of at least one first semiconductor chip; and
the flat conductor sheet is applied to at least some semiconductor chips by fixing at least one flat conductor sheet tape of the flat conductor sheet on a corresponding contact area of an active top side of the second semiconductor chip.

13. The method of claim 10, wherein the overall top side formed on the adhesive layer of the auxiliary carrier comprises a coplanar surface defined by the flat conductor sheet tape portions, active top sides of semiconductor chips and a corresponding side of the plastics composition.

* * * * *